(12) United States Patent
Tajiri et al.

(10) Patent No.: US 10,522,730 B2
(45) Date of Patent: Dec. 31, 2019

(54) LED LIGHTING APPARATUS

(71) Applicant: ROHM CO., LTD., Kyoto-shi, Kyoto (JP)

(72) Inventors: Hiroyuki Tajiri, Kyoto (JP); Yuya Hasegawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 135 days.

(21) Appl. No.: 15/459,905

(22) Filed: Mar. 15, 2017

(65) Prior Publication Data
US 2017/0268753 A1    Sep. 21, 2017

(30) Foreign Application Priority Data

Mar. 18, 2016 (JP) ................................ 2016-055100
Mar. 18, 2016 (JP) ................................ 2016-055101
Dec. 5, 2016 (JP) ................................ 2016-235796

(51) Int. Cl.
| | |
|---|---|
| *H01L 33/62* | (2010.01) |
| *H01L 25/075* | (2006.01) |
| *H01L 25/16* | (2006.01) |
| *H05K 1/02* | (2006.01) |
| *H05K 3/34* | (2006.01) |

(52) U.S. Cl.
CPC .......... *H01L 33/62* (2013.01); *H01L 25/0753* (2013.01); *H01L 25/167* (2013.01); *H05K 1/0268* (2013.01); *H05K 3/3431* (2013.01); *H05K 2201/099* (2013.01); *H05K 2201/0989* (2013.01); *H05K 2201/10106* (2013.01); *H05K 2203/049* (2013.01); *Y02P 70/613* (2015.11)

(58) Field of Classification Search
CPC ... H01L 33/62; H01L 25/0753; H01L 25/167; H05K 1/0268; H05K 3/3431

USPC .................................................. 362/249.02
See application file for complete search history.

(56) References Cited

U.S. PATENT DOCUMENTS

| | | | | |
|---|---|---|---|---|
| 7,923,833 | B2* | 4/2011 | Furukawa ........... | H01L 23/3735 257/705 |
| 8,237,339 | B2* | 8/2012 | Chen ..................... | F21V 3/02 313/46 |
| 2008/0170396 | A1* | 7/2008 | Yuan ..................... | F21K 9/00 362/244 |
| 2012/0086024 | A1* | 4/2012 | Andrews ............ | H01L 25/0753 257/88 |

(Continued)

FOREIGN PATENT DOCUMENTS

JP       2015-122377 A       7/2015

*Primary Examiner* — Julie A Bannan
(74) *Attorney, Agent, or Firm* — Hamre, Schumann, Mueller & Larson, P.C.

(57) ABSTRACT

An LED lighting apparatus is provided. The LED lighting apparatus includes LED chips, a substrate, and an electronic element. The substrate includes a mount surface on which the LED chips are mounted. The LED chips are arranged at or near a center of the mount surface of the substrate. The substrate includes a base, a wiring pattern, and an insulating layer. The wiring pattern is formed on the base. The insulating layer is formed on the base or the wiring pattern and formed with a plurality of openings. The wiring pattern includes pad portions comprising parts of the wiring pattern, respectively. Each of the parts of the wiring pattern is exposed through one of the openings of the insulating layer as viewed in a thickness direction of the substrate. Each of the LED chips is mounted on one of the pad portions.

26 Claims, 10 Drawing Sheets

(56) References Cited

U.S. PATENT DOCUMENTS

2014/0016318 A1* 1/2014 Pokrajac ............... F21V 7/0083
                                                        362/247
2014/0340890 A1* 11/2014 Hata .................... A01G 7/045
                                                        362/231
2014/0369056 A1* 12/2014 Kwon ..................... F21K 9/00
                                                        362/375
2015/0176820 A1* 6/2015 Abe ........................ F21V 9/08
                                                        362/235

* cited by examiner

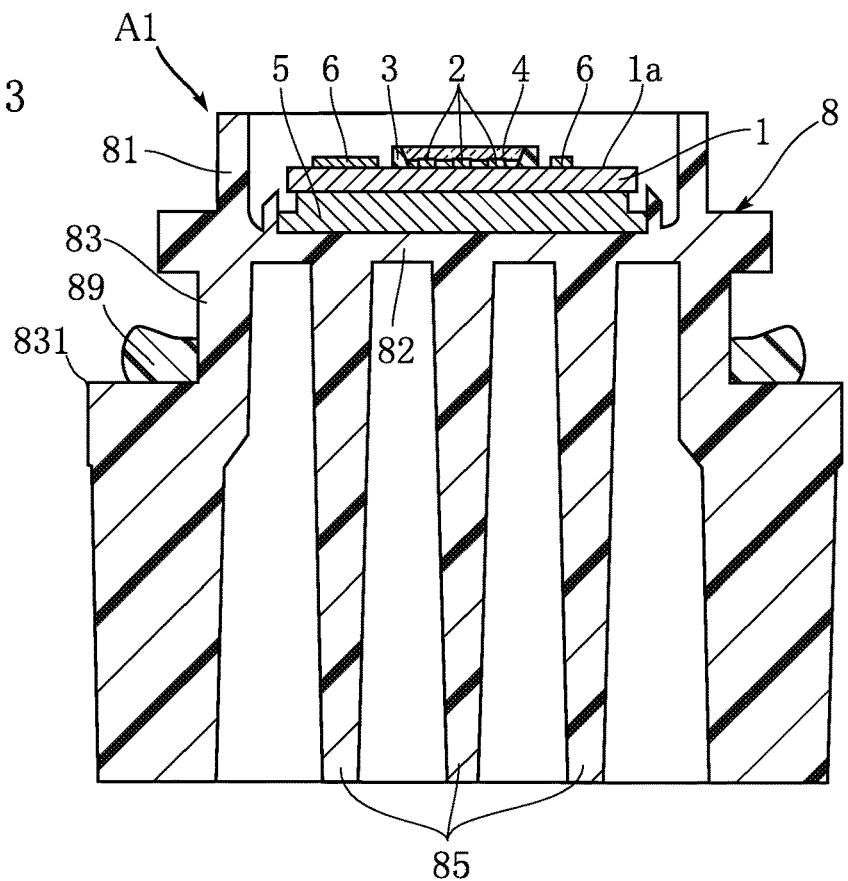
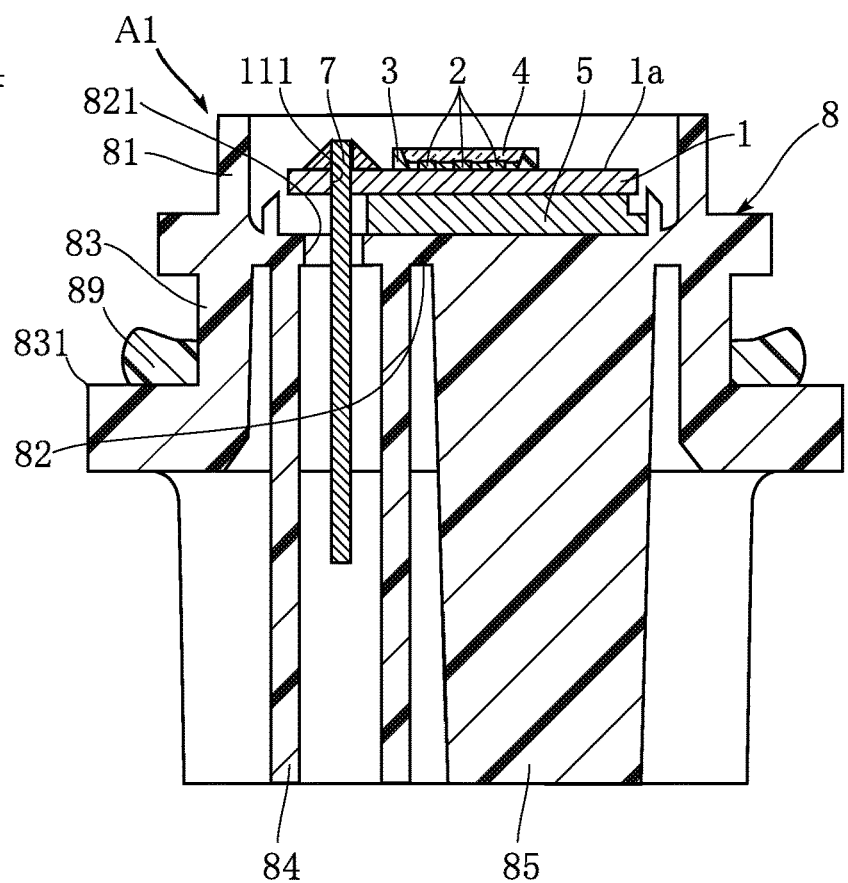

LED LIGHTING APPARATUS

FIELD

The present disclosure relates to an LED lighting apparatus having a plurality of LED chips.

BACKGROUND

Conventionally, use has been made of lighting apparatuses having a plurality of LED chips as its light source. An example of such an LED lighting apparatus is disclosed in JP-A-2015-122377. The LED lighting apparatus disclosed in this document has a plurality of LED chips mounted on a substrate formed with a wiring pattern.

SUMMARY

According to a first aspect of the present disclosure, an LED lighting apparatus is provided. The LED lighting apparatus includes: a plurality of LED chips; a substrate; and an electronic element. The substrate includes a mount surface on which the LED chips are mounted. The electronic element is mounted on the substrate and includes a circuit that causes the LED chips to emit light. The LED chips are arranged at or near a center of the mount surface of the substrate. The substrate includes a base, a wiring pattern, and an insulating layer. The wiring pattern is formed on the base. The insulating layer is formed on the base or the wiring pattern and is formed with a plurality of openings. The wiring pattern includes a plurality of pad portions comprising parts of the wiring pattern, respectively. Each of the parts of the wiring pattern is exposed through one of the openings of the insulating layer as viewed in a thickness direction of the substrate. Each of the LED chips is mounted on one of the pad portions.

According to a second aspect of the present disclosure, an LED lighting apparatus is provided. The LED lighting apparatus includes a plurality of LED chips and a substrate. The substrate includes a mount surface on which the LED chips are mounted. The LED chips are arranged at or near a center of the mount surface of the substrate. The substrate includes a base and a wiring pattern formed on the base. The wiring pattern includes a plurality of probe pads. The probe pads include a pair of probe pads that are electrically connected to each other via any one of the LED chips.

Further features and advantages of the present disclosure will become apparent from the following detailed description with reference to the attached drawings.

BRIEF DESCRIPTION OF THE DRAWINGS

FIG. 3 is a sectional view taken along lines III-III in FIG. 2;

FIG. 4 is a sectional view taken along lines IV-IV in FIG. 2;

DESCRIPTION OF THE PREFERRED EMBODIMENTS

Figure 1:
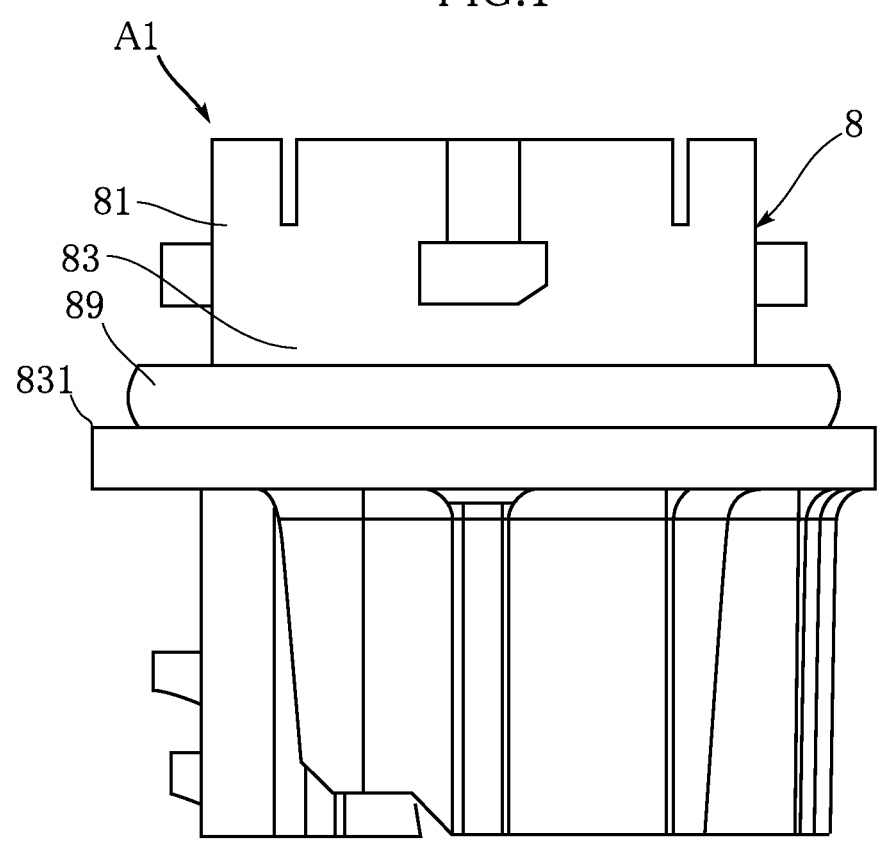
FIG. 1 is a front view of an LED lighting apparatus according to a first embodiment of the present disclosure.

Preferred embodiments of the present disclosure are described below with reference to the drawings.

FIGS. 1-10 show an LED lighting apparatus according to a first embodiment of the present disclosure. The LED lighting apparatus A1 of the present embodiment includes a substrate 1, a plurality of LED chips 2, a frame 3, a sealing resin portion 4, a heat sink 5, a plurality of electronic elements 6, a plurality of connection terminals 7 and a socket 8. Although the LED lighting apparatus A1 may be used as a light source unit for mounting to a car, for example, the application of the LED lighting apparatus is not particularly limited.

Figure 2:
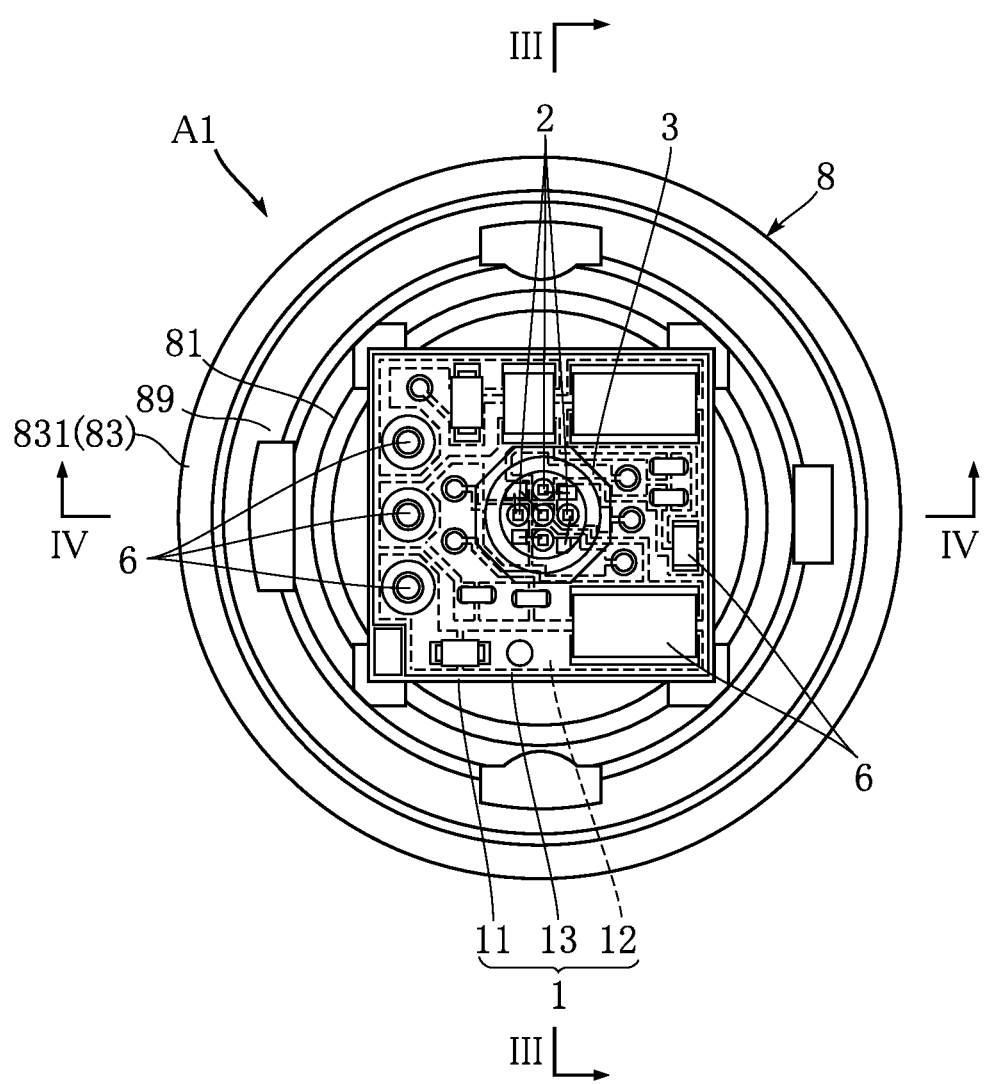
FIG. 2 is a plan view of the LED lighting apparatus of FIG. 1.
Figure 5:
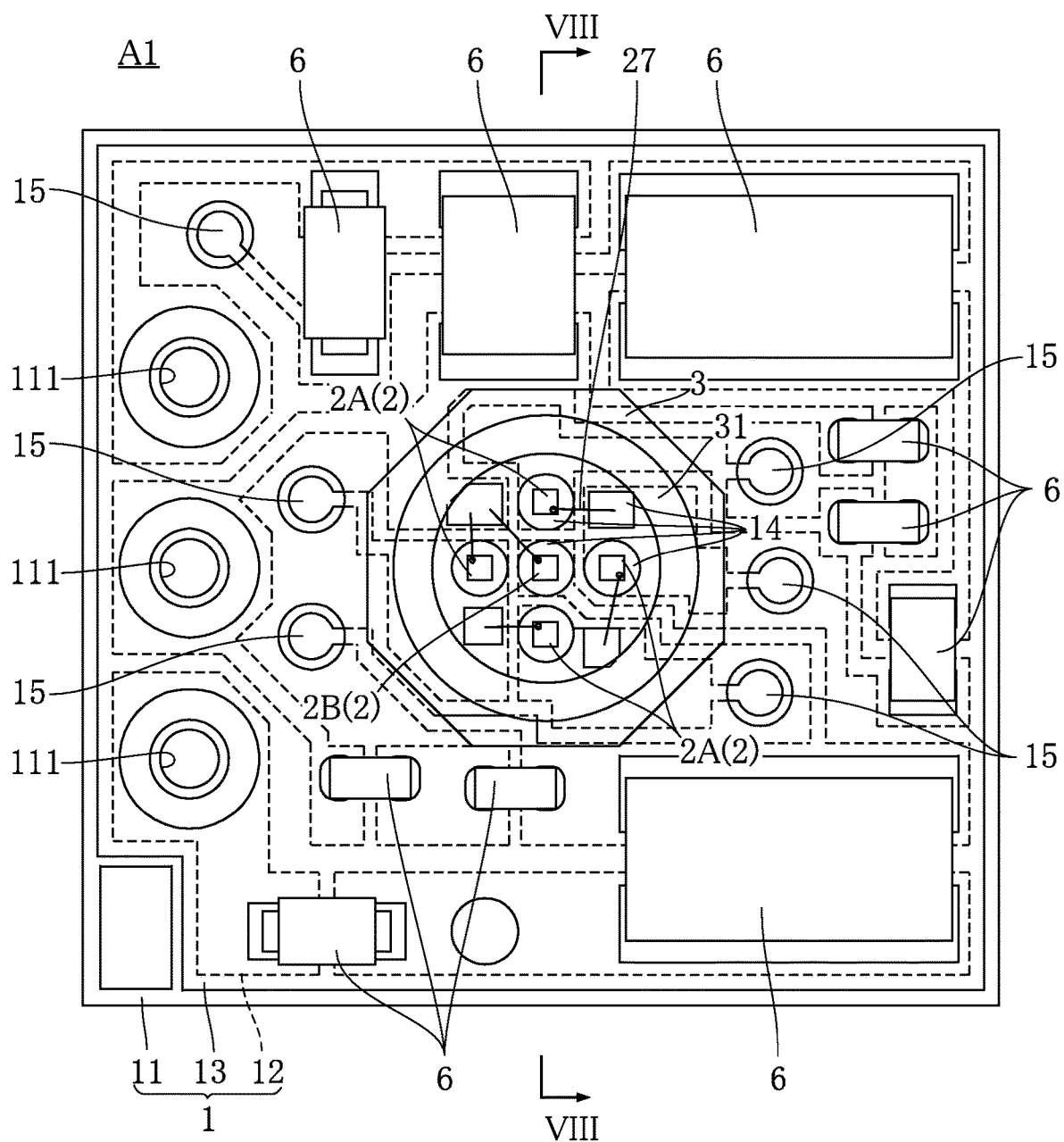
FIG. 5 is a plan view illustrating a main part of the LED lighting apparatus of FIG. 1.
Figure 6:
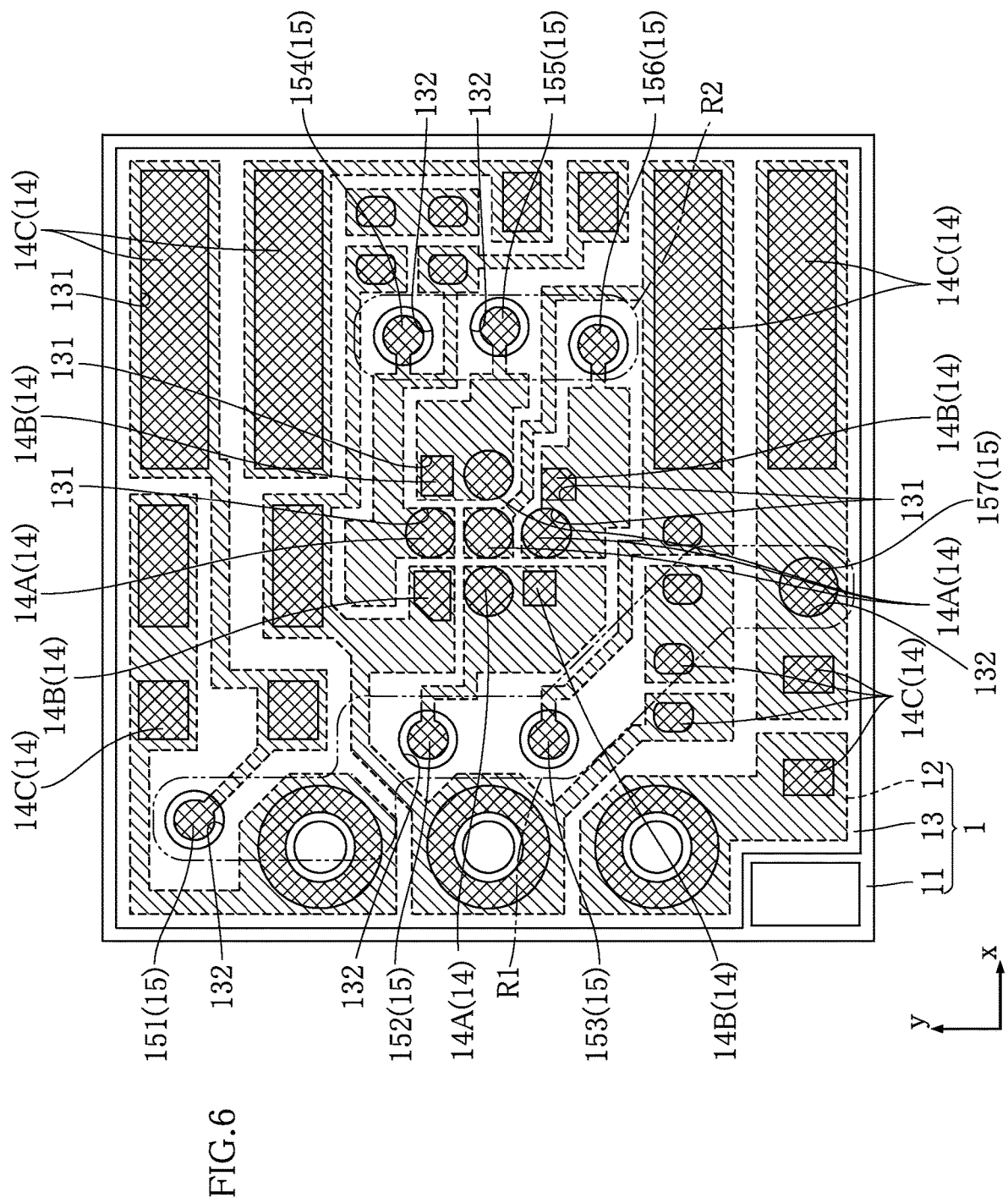
FIG. 6 is a plan view illustrating the substrate of the LED lighting apparatus shown in FIG. 5 before the LED chips, electronic elements and a frame are mounted.
Figure 7A:
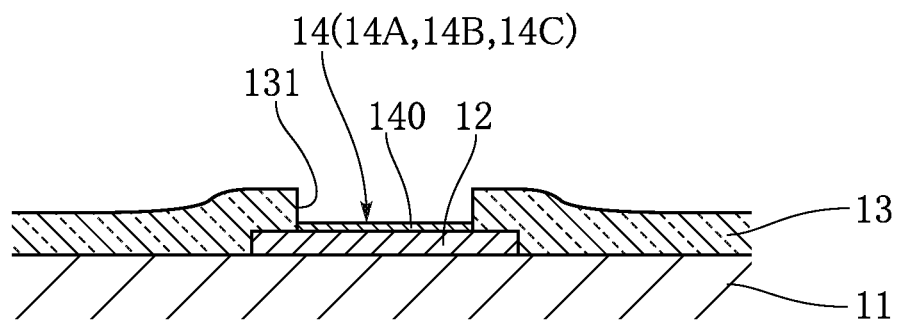
FIG. 7A is a sectional view illustrating a pad portion formed on the substrate shown in FIG. 6.
Figure 7B:
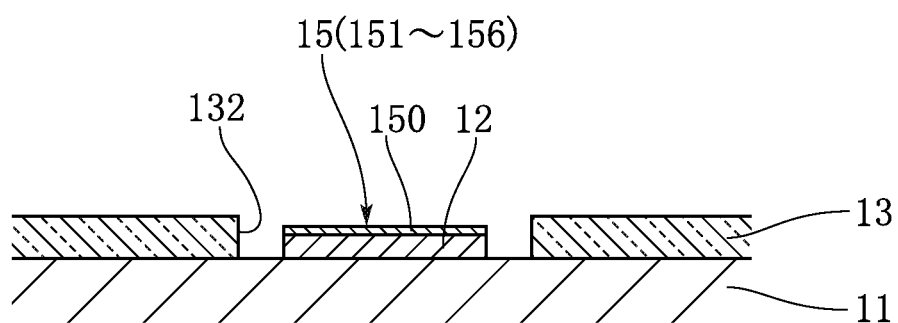
FIG. 7B is a sectional view illustrating an example of probe pad formed on the substrate shown in FIG. 6.
Figure 7C:
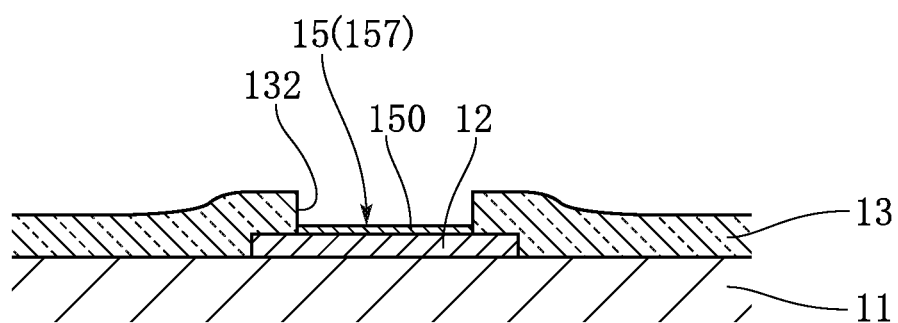
FIG. 7C is a sectional view illustrating another example of probe pad formed on the substrate shown in FIG. 6.
Figure 8:
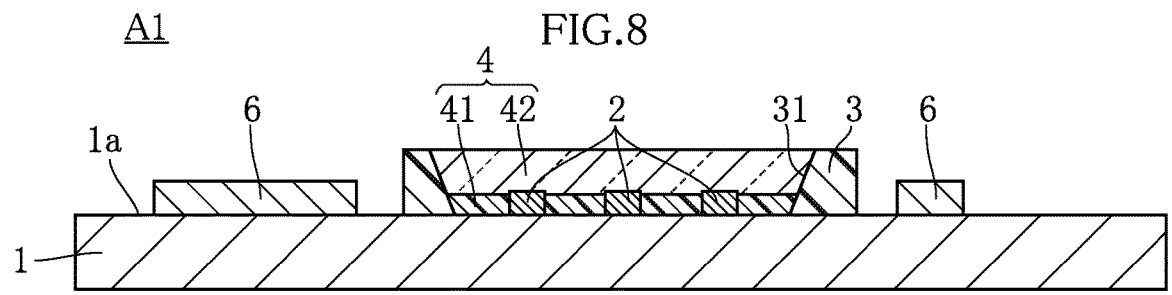
FIG. 8 is a sectional view taken along lines VIII-VIII in FIG. 5.
Figure 9:
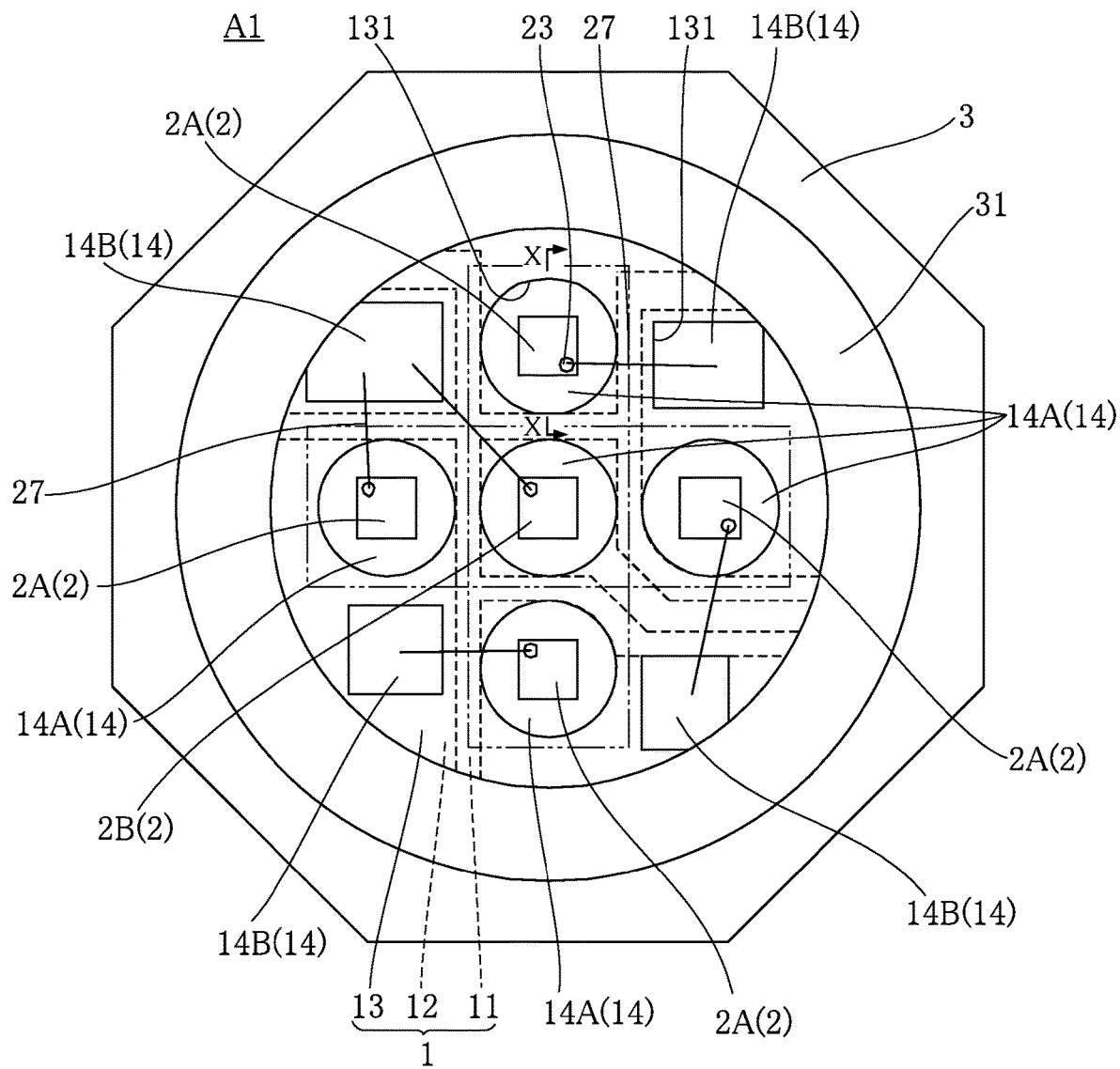
FIG. 9 is a plan view illustrating a main part of the LED lighting apparatus of FIG. 1 as enlarged.
Figure 10:
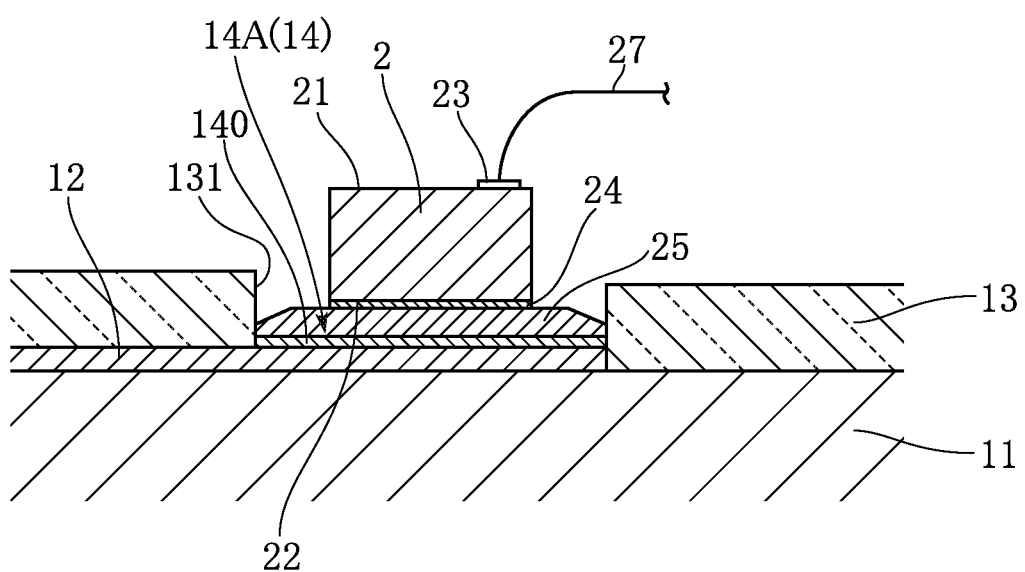
FIG. 10 is a sectional view taken along lines X-X in FIG. 9.

FIG. 1 is a front view of the LED lighting apparatus A1. FIG. 2 is a plan view of the LED lighting apparatus A1. FIG. 3 is a sectional view taken along lines III-III in FIG. 2. FIG. 4 is a sectional view taken along lines IV-IV in FIG. 2. FIG. 5 is a plan view of a main part of the LED lighting apparatus A1. FIG. 6 is a plan view illustrating the substrate 1 before the LED chips 2, the electronic elements 6 and the frame 3 are mounted. FIG. 7A is a sectional view illustrating a pad portion formed on the substrate shown in FIG. 6. FIG. 7B is a sectional view illustrating an example of probe pad formed on the substrate shown in FIG. 6. FIG. 7C is a sectional view illustrating another example of probe pad formed on the substrate shown in FIG. 6. FIG. 8 is a sectional view taken along lines VIII-VIII in FIG. 5. FIG. 9 is a plan view illustrating a main part of the LED lighting apparatus A1 as enlarged. FIG. 10 is an enlarged schematic sectional view taken along lines X-X in FIG. 9. For the convenience of understanding, the sealing resin portion 4 is not illustrated in FIGS. 2, 5 and 9.

The substrate 1 includes a base 11, a wiring pattern 12 and an insulating layer 13. The base 11 is made of a ceramic material, for example, and rectangular as viewed in plan in this embodiment. The base 11 is formed with a plurality of through-holes 111. The wiring pattern 12 is formed on the obverse surface of the base 11 and made of a metal layer of Cu, Ni, Pd or Au, for example. For example, the wiring pattern 12 is 10 to 30 μm in thickness. As described later, the wiring pattern 12 constitutes pads on which the LED chips 2 are mounted. The wiring pattern 12 also constitutes pads on which the electronic elements 6 are mounted. The wiring pattern 12 also constitutes conduction paths for electrical connection to the LED chips or electrical connection between the electronic elements 6 and the LED chips 2. The wiring pattern 12 also constitutes probe pads for determining the properties of the LED chips 2 and electronic elements 6.

The insulating layer 13 is formed on the obverse surface of the base 11 and/or the wiring pattern 12 to cover the most part of the base 11 as viewed in the thickness direction of the substrate 1. The insulating layer 13 is made of an insulating material such as $SiO^2$. As shown in FIG. 6, the insulating layer 13 is formed with a plurality of openings 131 and 132. The openings 131 are provided at positions overlapping with the wiring pattern 12 as viewed in the thickness direction of the substrate 1. Parts of the wiring pattern 12 which are exposed through the openings 131 (as viewed in the thickness direction of the substrate 1) constitute pad portions 14 described later. The openings 132 are also provided at positions overlapping with the wiring pattern 12 as viewed in the thickness direction of the substrate 1. Parts of the wiring pattern 12 which are exposed through the openings 132 (as viewed in the thickness direction of the substrate 1) constitute probe pads 15 described later. In FIG. 6, the wiring pattern 12 is indicated by hatching with diagonal lines extending to the upper right, and the pad portions 14 and probe pads 15 are indicated by cross-hatching. For example, the insulating layer 13 is 5 to 20 μm in thickness.

As described above, the pad portions 14 are formed by the parts of the wiring pattern 12 which are exposed through the openings 131. The pad portions 14 are spaced apart from each other correspondingly to the openings 131. The pad portions 14 include a plurality of LED-mounting pads 14A, a plurality of wire-bonding pads 14B, and a plurality of electronic-part-bonding pads 14C. The LED-mounting pads 14A and the wire-bonding pads 14B are positioned at or near the center of the substrate 1 as viewed in the thickness direction of the substrate 1. In this embodiment, five LED-mounting pads 14A and four wire-bonding pads 14B are provided. As shown in FIG. 6, the wire-bonding pads 14B are farther away from the center of the substrate 1 than the LED-mounting pads 14A are, as viewed in the thickness direction of the substrate 1.

As described above, the probe pads 15 are formed by the parts of the wiring pattern 12 which are exposed through the openings 132. The probe pads 15 are spaced apart from each other correspondingly to the openings 132. In this embodiment, seven probe pads 15 are provided on the substrate 1. The probe pads 15 are described later.

FIGS. 7A-7C illustrate sectional structures of the pad portions 14 and probe pads 15 shown in FIG. 6. As illustrated in FIG. 7A, each of the pad portions 14 includes a metal plating layer 140. The metal plating layer 140 covers the parts of the pad portion 14 which are exposed through the opening 131 (as viewed in the thickness direction of the substrate 1). Similarly, as shown in FIGS. 7B and 7C, each of the probe pads 15 includes a metal plating layer 150. The metal plating layer 150 covers the parts of the probe pad 15 which are exposed through the opening 132 (as viewed in the thickness direction of the substrate 1). Each of the probe pads 15 shown in FIG. 7B (six probe pads 151-156 described later) occupies a part of the area within the opening 132. The probe pad 15 shown in FIG. 7C (probe pad 157 described later) occupies the entirety of the area within the opening 132 as viewed in plan. For example, the metal plating layers 140 and 150 may be Au plating layers. For example, the metal plating layers 140 and 150 is 0.05 to 0.2 μm in thickness.

The LED chips 2 constitute a light source of the LED lighting apparatus A1. The LED chips 2 are mounted on the upper surface (mount surface 1a shown in FIGS. 3 and 4) of the substrate 1. As shown in FIGS. 9 and 10, each of the LED chips 2 has an obverse surface 21, a reverse surface 22, a first electrode pad 23 and a second electrode pad 24.

Each of the LED chips 2 includes layers of semiconductor materials, such as a GaN-based semiconductor, as laminated. When the LED chip 2 is formed of a GaN-based semiconductor, the LED chip 2 may emit blue light.

The obverse surface 21 and the reverse surface 22 face away from each other. The obverse surface 21 faces away from the substrate 1. The reverse surface 22 faces toward the substrate 1.

The first electrode pad 23 is formed on the obverse surface 21. The first electrode pad 23 is made of a plating layer of Cu, Ni, Al or Au, for example. The second electrode pad 24 is formed on the reverse surface 22. The second electrode pad 24 is made of a plating layer of Cu, Ni, Al or Au, for example. For example, the second electrode pad 24 is formed entirely on the reverse surface 22.

The first electrode pad 23 has a first polarity, whereas the second electrode pad 24 has a second polarity. For example, when the first electrode pad 23 has a positive pole (p type), the second electrode pad 24 has a negative pole (n type). Alternatively, the first electrode pad 23 may have a negative pole (n type), and the second electrode pad 24 may have a positive pole (p type).

The second electrode pad 24 is bonded to the LED-mounting pad 14A via a conductive paste layer 25. The conductive paste layer 25 may be an Ag paste layer, and be formed by solidifying Ag paste. The LED chip 2 is "die-bonded" to the LED-mounting pad 14A.

A wire 27 is bonded to the first electrode pad 23. Specifically, one end of the wire 27 is bonded to the first electrode pad 23 (LED chip 2), whereas the other end is bonded to a relevant wire-bonding pad 14B.

Light generated at the light-emitting portion of the LED chip 2, such as an active layer, is emitted mainly from the obverse surface 21. For example, as viewed in the thickness direction of the substrate 1, the LED chip 2 is in the form of a square with a side of about 400 to 600 μm. For example, the LED chip 2 is about 150 to 300 μm in thickness.

The LED chips 2 are arranged as concentrated at the center of the mount surface 1a of the substrate 1. This means that the LED chips 2 are arranged at or near the center of the mount surface 1a of the substrate 1. In this embodiment, the LED chips 2 include a plurality of first LED chips 2A and a second LED chip 2B. The first LED chips 2A are connected in series to each other and arranged to form a circle as viewed in plan. The number of the first LED chips 2A is not particularly limited, but four in the illustrated example. The second LED chip 2B is connected in parallel to the first LED chips 2A and surrounded by the first LED chips 2A as viewed in plan. Such connection of the first LED chips 2A and the second LED chip 2B is realized by bonding the wires 27 to the first electrode pads 23 of the LED chips 2 and the wire-bonding pads 14B positioned adjacent to the LED chips 2.

In this embodiment, the LED chips 2 are arranged at a constant pitch and at a predetermined mounting density. For example, the mounting density of the LED chips 2 is in a range of 0.5 to 1.0 per 1 $mm^2$. As viewed in the thickness direction of the substrate 1, the area of each LED-mounting pad 14A is at least twice the area of each LED chip 2.

An example of arrangement of the LED chips 2 and dimensions of the LED chips or the LED-mounting pads 14 is described below. As shown in FIG. 9, the LED chips 2 may be arranged such that one LED chip 2 is positioned within a respective one of the square regions indicated by double-dashed lines in the figure. Each of the square regions may be 1.3×1.3 mm. Each LED chip 2 may be in the form of a square of 0.5×0.5 mm and thus have an area of 0.25 mm² as viewed in the thickness direction of the substrate. Each LED-mounting pad 14A may be in the form of a circle having a diameter of 1 mm and an area of 0.785 mm² as viewed in the thickness direction. Thus, the area of each LED-mounting pad 14A is 3.14 times the area of each LED chip 2. In this example, the mounting density of the LED chips 2 is 0.592 per 1 mm².

The frame 3 is formed on the substrate 1 to surround the LED chips 2 as viewed in plan. For example, the frame 3 is made of white nylon resin. The height of the frame 3 is higher than that of the LED chips 2. The frame 3 has a reflective surface 31 inclined with respect to the thickness direction of the substrate 1 and surrounding the LED chips 2 as viewed in plan. The reflective surface 31 of the frame 3 is circular as viewed in plan. The outer configuration of the frame 3 is polygonal as viewed in plan and octagonal in this embodiment.

As shown in FIG. 8, the sealing resin portion 4 fills the region surrounded by the frame 3 and covers the LED chips 2. The sealing resin portion 4 transmits the light emitted from the LED chips 2. In this embodiment, the sealing resin portion 4 is made up of a first sealing resin part 41 and a second sealing resin part 42.

The first sealing resin part 41 covers at least a part of each LED chip 2 excluding the obverse surface 21 of each LED chip 2. In this embodiment, the first sealing resin part 41 covers most part of the LED chips 2. For example, the first sealing resin part 41 is made of white silicone resin.

The second sealing resin part 42 covers the first sealing resin part 41, thereby covering the portions (including the obverse surfaces 21) of the LED chips 2 which are not covered by the first sealing resin part 41. For example, the second sealing resin part 42 is made of transparent silicone resin. Alternatively, the second sealing resin part 42 may be made of transparent silicone resin in which a fluorescent material is mixed. For example, the fluorescent material emits yellow light when excited by blue light. With the second sealing resin part 42 laminated on the first sealing resin part 41, light is reflected at the surface of the first sealing resin part 41 which adjoins the second sealing resin part 42, while passing through the second sealing resin part 42.

The electronic elements 6 shown in FIG. 5 constitute a light emitting circuit for realizing light emission from the LED chips 2. Examples of the electronic elements 6 include a diode, a capacitor and a resistor.

The substrate 1 shown in FIGS. 6 and 7 may be made by the method described below. First, a plurality of through-holes 111 are formed in the base 11 by laser machining, for example. Then, a wiring pattern 12 and an insulating layer 13 are formed on the base 11. To form the wiring pattern 12, Cu is first printed into a pattern and baked. Then, the insulating layer 13 is formed on the base 11 and/or the Cu pattern. Specifically, the insulating layer 13 is formed by printing and baking SiO² to include a plurality of openings 131 and 132 exposing portions of the Cu pattern. Then, Ni, Pd or Au, for example, is laminated by electroless plating on the portions of the Cu pattern which are exposed through the openings 131 or 132. Thus, the wiring pattern 12 is formed. Then, metal plating layers 140 and 150 are formed. Specifically, the metal plating layers 140 and 150 are formed by laminating Au by electroplating on the surfaces of the wiring pattern 12 which are exposed through the openings 131 or 132. In this embodiment, the parts of the wiring pattern 12 which are exposed through the openings 131 and the metal plating layer 140 covering these portions constitute the pad portions 14. Similarly, the parts of the wiring pattern 12 which are exposed through the openings 132 and the metal plating layer 150 covering these portions constitute the probe pads 15.

With the above-described method, a plurality of substrates 1 for a plurality of LED lighting apparatuses A1 can be collectively prepared. A method for collectively making a plurality of LED lighting apparatuses A1 is described below. Note, however, that a method for making an LED lighting apparatus A1 one by one may be employed. First, an aggregate board including a plurality of portions to become substrates 1 is prepared by the above-described method, and electronic elements 6 are mounted on the aggregate board. Specifically, solder paste is first printed on the electronic-part-bonding pads 14C, and then electronic elements 6 are disposed on the solder paste. Subsequently, the solder paste is molten in a reflow furnace and then hardened, whereby mounting of the electronic elements 6 is completed. Then, LED chips 2 are mounted on the aggregate board. Specifically, for example, Ag paste is first applied to the LED-mounting pads 14A, and then LED chips 2 are die-bonded onto the paste. Then, wires 27 are bonded to the first electrode pads 23 of the LED chips 2 and the wire-bonding pads 14B. Then, frames 3 are attached to the aggregated board with an adhesive, for example. Then, sealing resin portion 4 is loaded to fill the regions surrounded by the frames 3. Specifically, a white silicone resin material, for example, is applied to the regions surrounded by the frames 3 and then hardened to form the first sealing resin parts 41. Then, a transparent silicone resin material, for example, is applied onto the first sealing resin parts 41 and then hardened to form the second sealing resin parts 42. Thereafter, the aggregate board is divided into a plurality of substrates 1, whereby a plurality of LED lighting apparatuses A1 as shown in FIG. 5 for example are obtained.

In this embodiment, the (seven) probe pads 15 and the (three) exposed portions of the wiring pattern 12 which surround the through-holes 111 may be used to determine the properties of the LED chips 2 and the electronic elements 6. Note that the seven probe pads 15 are designated as 151-157 in FIG. 6 for the convenience of understanding.

As will be understood from FIGS. 5 and 6, in this embodiment, the probe pads 154 and 155 are electrically connected to each other via a single LED chip 2 (the LED chip 2 on the upper side in the figures). Thus, the properties (e.g. forward voltage) of this LED chip 2 can be measured by bringing probes into contact with the probe pads 154 and 155. Also, the probe pads 152 and 154 are electrically connected to each other via a single LED chip 2, so are the probe pads 152 and 156, the probe pads 155 and 156, and the probe pads 153 and 154. Thus, the properties of each LED chip 2 can be determined by bringing probes into contact with the relevant pair of probe pads.

Also, the properties of the electronic elements 6 can be determined by using paired probe pads 15. For example, the pair of probe pads 151 and 154 can be used to determine the properties of the electronic elements 6. The properties of other electronic elements 6 can also be determined by using an appropriate probe pad 15 and the relevant exposed portion of the wiring pattern 12 which surrounds a through-hole 111. Examples of the properties to be measured include a forward voltage, a capacitance and a resistance. The forward voltage may be measured for an electronic element 6 as a diode. The capacitance may be measured for an electronic element 6 as a capacitor. The resistance may be measured for an electronic element 6 as a resistor.

As shown in FIG. 6, in this embodiment, the (seven) probe pads 15 are arranged as divided into two regions (the first region R1 and the second region R2). The first region R1 and the second region R2 are spaced apart from each other in the direction x perpendicular to the thickness direction of the substrate 1 across the center region of the substrate 1 where the LED chips 2 are arranged. The probe pads 151, 152, 153 and 157 are arranged in the first region R1, whereas the probe pads 154, 155 and 156 are arranged in the second region R2. Of the probe pads 151, 152, 153 and 157 in the first region R1, the two probe pads 152 and 153 are aligned in the direction y perpendicular to both of the thickness direction of the substrate 1 and the direction x. The three probe pads 154, 155 and 156 in the second region R2 are aligned in the direction y.

As shown in FIGS. 1-4, the socket 8 houses the substrate 1 and defines the outer shape of the LED lighting apparatus A1. The socket 8 includes a light-emitting cylindrical portion 81, a bottom plate portion 82, a coupling-side cylindrical portion 83, a terminal cylindrical portion 84 and a plurality of fins 85. The socket 8 is made of a resin mixed with carbon. For example, the resin is PET.

The light-emitting cylindrical portion 81 is open to the side toward which the mount surface 1a of the substrate 1 faces. In this embodiment, the light-emitting cylindrical portion 81 is generally cylindrical. The bottom plate portion 82 closes the light-emitting cylindrical portion 81 from the side opposite to the side to which the mount surface 1a of the substrate 1 faces. The fins 85 project from the bottom plate portion 82 away from the substrate 1. In this embodiment, each of the fins 85 is in the form of a flat plate.

The coupling-side cylindrical portion 83 projects from the bottom plate portion 82 away from the light-emitting cylindrical portion 81. The coupling-side cylindrical portion 83 houses the fins 85 at least partially. The terminal cylindrical portion 84 projects from bottom plate portion 82 away from the light-emitting cylindrical portion 81. The terminal cylindrical portion 84 has generally the same length as the fins 85.

The coupling-side cylindrical portion 83 has a stepped portion 831. The stepped portion 81 projects outward from the lower end of the coupling-side cylindrical portion 83. A packing 89 is fitted to the stepped portion 831. The packing 89 is provided for preventing moisture or the like from entering the LED lighting apparatus A1 when the LED lighting apparatus A1 is used as mounted to a vehicle, for example.

The heat sink 5 is arranged between the substrate 1 and the bottom plate portion 82 of the socket 8. The heat sink 5 is made of a metal such as aluminum.

The connection terminals 7 are inserted in the through-holes 111 formed in the base 11 of the substrate 1 and electrically connected to the wiring pattern 12 of the substrate 1. The upper ends of the connection terminals 7 are electrically connected to the wiring pattern 12 by soldering, for example. The bottom plate portion 82 of the socket 8 is formed with through-holes 821 for receiving the connection terminals 7. The heat sink 5 is provided at a position avoiding the connection terminals 7.

In this embodiment, the LED chips 2 are arranged as concentrated at the center of the substrate 1. As described above, the substrate 1 has the insulating layer 13 formed on the base 11 and/or the wiring pattern 12, and the insulating layer 13 has a plurality of openings 131. Pad portions 14 for mounting the LED chips 14 (LED-mounting pads 14A) are formed by the parts of the wiring pattern 12 which are exposed through the opening 131. This structure allows the LED chips 2 to be arranged as collected at predetermined positions while avoiding unfavorable electrical connection between the LED chips 2.

Each LED chip 2 is mounted to a pad portion 14 (LED-mounting pad 14A) via a conductive paste layer 25. The conductive paste layer 25 is positioned between a portion of the wiring pattern 12 which is exposed through an opening 131 and the LED chip 2. This structure allows the entire surface of the second electrode pad 24 on the reverse surface 22 of the LED chip 2 to be bonded to the conductive paste layer 25 while the conductive paste layer 25 is prevented from protruding from the opening 131. Thus, proper mounting of the LED chip 2 by die-bonding to the substrate 1 is achieved.

The openings 131 at the pad portions 14 for mounting the LED chips 2 (LED-mounting pads 14A) are circular as viewed in the thickness direction of the substrate 1. This structure also helps prevent the conductive paste layers 25 from protruding from the openings 131.

The mounting density of the LED chips 2, which are arranged as concentrated at the center of the substrate 1, is in a range of 0.5 to 1.0 per 1 $mm^2$. A plurality of wire-bonding pads 14B for bonding wires 27 connected to the LED chips 2 are arranged around the LED chips 2. These wire-bonding pads 14B comprise parts of the wiring pattern 12 which are exposed through the openings 131 and are farther away from the center of the substrate 1 than the LED-mounting pads 14A are, as viewed in the thickness direction of the substrate 1. This structure allows the LED chips 2 to be concentrated at the center of the substrate 1 and the wires 27 to be bonded properly for each of the LED chips 2.

The pad portions 14 include metal plating layers 140 that cover the parts of the wiring pattern 12 which are exposed through the openings 131. Since the metal plating layers 140 are formed only at the pad portions 14, a relatively small amount of material suffices for the metal plating layers 140.

In this embodiment, the LED chips 2 are arranged as concentrated at the center of the substrate 1, as described above. The substrate 1 is provided with probe pads 15 comprising part of the wiring pattern 12. These probe pads 15 are arranged in such a manner that paired ones of the probe pads can be electrically connected to each other via a relevant LED chip 2. This allows individually checking each of the LED chips 2 for properties. Thus, the electrical properties such as IF-VF characteristics of the individual LED chips 2 can be measured accurately.

In this embodiment, appropriate pairs of the probe pads 15 can be electrically connected to each other via relevant electronic elements 6, so that properties of the electronic elements 6 can be determined. Thus, the light emission performance of the LED lighting apparatus A1 as a whole can be precisely measured.

As described above, the probe pads 15 are arranged as divided into the first region R1 and the second region R2 that are spaced apart from each other in the direction x, with the LED chips 2 arranged between the two regions. In each of the first region R1 and the second region R2, two or more probe pads 15 are aligned in the direction y perpendicular to both of the thickness direction of the substrate 1 and the direction x. This arrangement is advantageous in terms of space efficiency for the condition where a predetermined number of parts (LED chips 2 and electronic elements 6) need to be mounted on the substrate 1 of a limited size.

The probe pads 15 comprise parts of the wiring pattern 12 which are exposed through the openings 132. This arrangement prevents unintentional electrical conduction from being established between the probe pads 15 and the wiring pattern 12 during the measurement using the probe pads 15. Thus, measurement using the probe pads 15 can be performed properly.

The probe pads 15 include metal plating layers 150 that cover the parts of the wiring pattern 12 which are exposed through the openings 132. Since the metal plating layers 150 are formed only at the probe pads 15, a relatively small amount of material suffices for the metal plating layers 150.

As described above, the sealing resin portion 4 filling the inside of the frame 3 includes a first sealing resin part 41 made of a white resin and covering the LED chips 2 except the obverse surfaces 21, and a second sealing resin part 42 that covers the first sealing resin part 41 and transmits light. With this structure, light emitted from the LED chips 2 is reflected at the surface of the first sealing resin part 41 which adjoins the second sealing resin part 42. This arrangement is suitable for enhancing the light emitting efficiency of the LED lighting apparatus A1.

The substrate 1 is housed in the socket 8. The bottom plate portion 82 of the socket 8 closes from the side opposite the side to which the mount surface 1a of the substrate 1 faces. Thus, heat from the LED chips 2 can be dissipated through the substrate 1. Moreover, the heat sink 5 arranged between the bottom plate portion 82 of the socket 8 and the substrate 1 promotes dissipation of heat from the LED chips 2. The fins 85 projecting from the bottom plate portion 82 also enhance heat dissipation from the LED chips 2.

Figure 11:
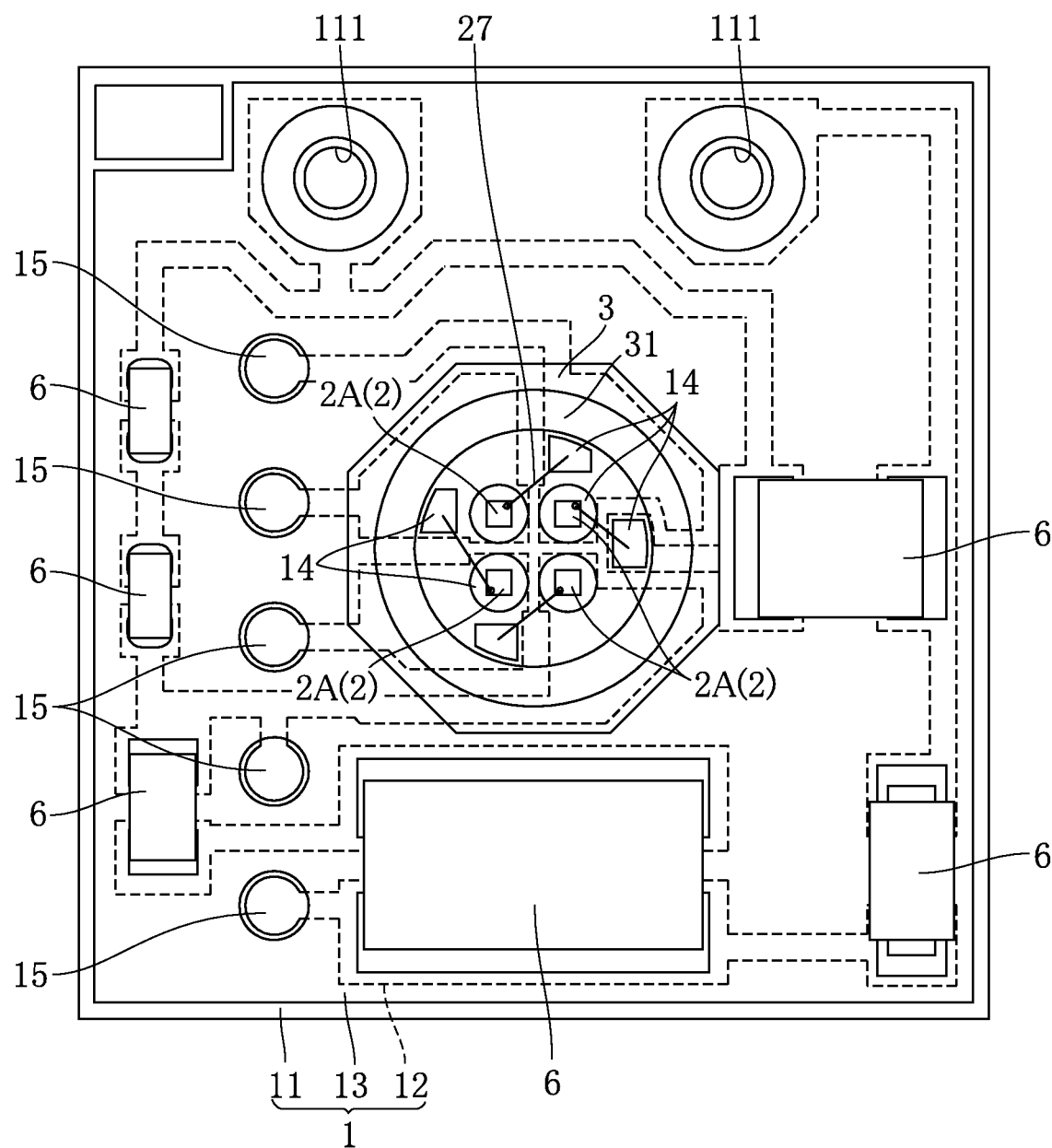
FIG. 11 is a plan view illustrating a main part of an LED lighting apparatus according to a second embodiment of the present disclosure.
Figure 12:
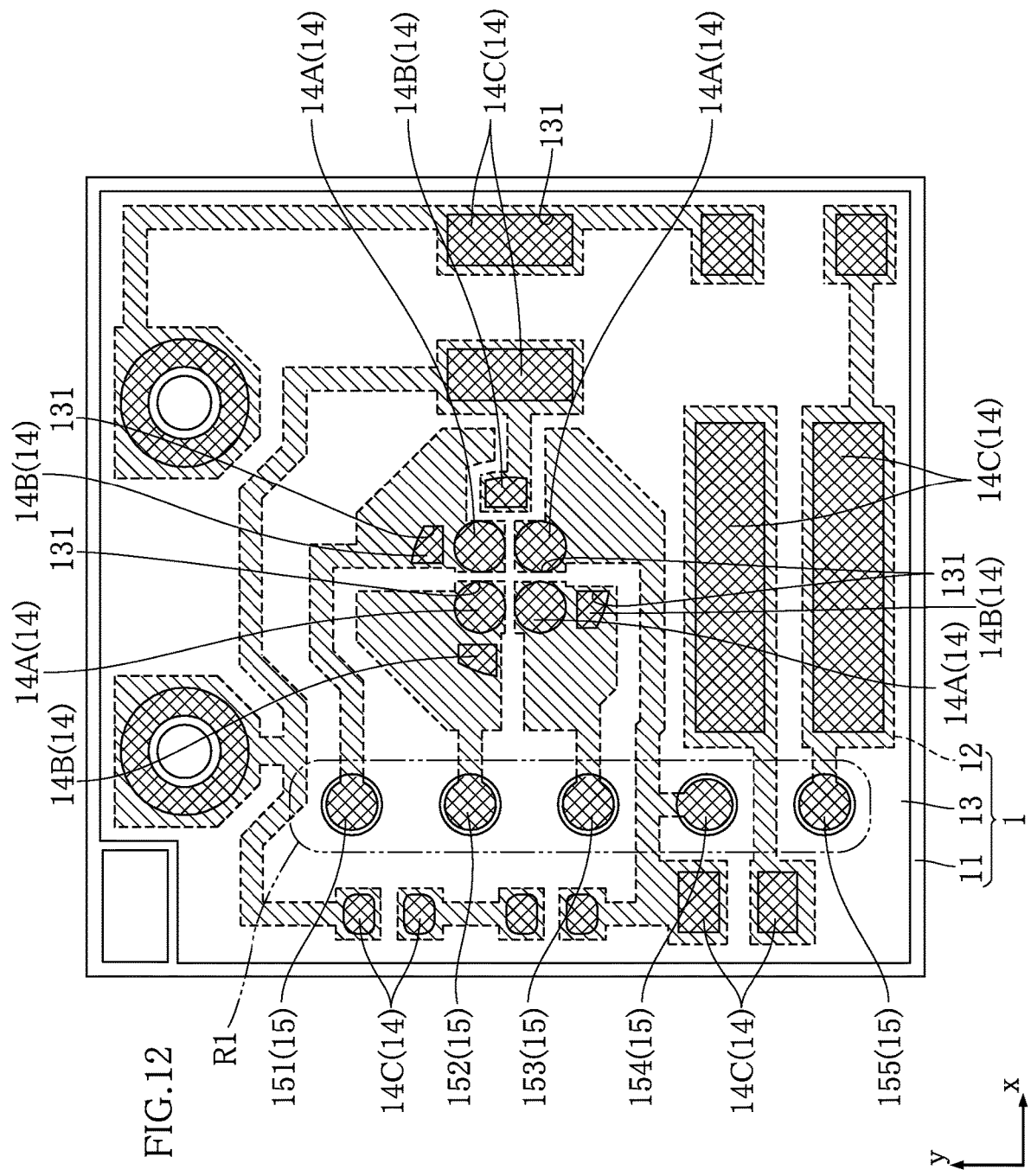
FIG. 12 is a plan view illustrating the substrate of the LED lighting apparatus shown in FIG. 11 before the LED chips, electronic elements and a frame are mounted.

FIG. 11 is a plan view illustrating a main part of an LED lighting apparatus according to a second embodiment of the present disclosure. The LED lighting apparatus A2 of this embodiment differs from the foregoing embodiment in structure and arrangement of the LED chips 2. Due to the change in arrangement of the LED chips 2, the pad portions 14, probe pads 15 and electronic elements 6 are also arranged in a manner different from the foregoing embodiment. FIG. 12 shows the substrate 1 of this embodiment before the LED chips 2, the electronic elements 6 and the frame 3 are mounted. In FIG. 12 and the subsequent drawings, the elements that are identical or similar to those of the foregoing embodiment are designated by the same reference signs as those used for the foregoing embodiment, and the explanation is omitted appropriately.

In this embodiment, the LED chips 2 include only four first LED chips 2A connected in series to each other. The four first LED chips 2A are arranged to form a circle.

In this embodiment, the substrate 1 is provided with five probe pads 15. In this embodiment, these probe pads 15 and the (two) exposed portions of the wiring pattern 12 which surround the through-holes 111 can be used to determine the properties of the LED chips 2 and the electronic elements 6. Note that the five probe pads 15 are designated as 151-155 in FIG. 12 for the convenience of understanding.

As will be understood from FIGS. 11 and 12, in this embodiment, the probe pads 151 and 152 are electrically connected to each other via a single LED chip 2 (the LED chip 2 located on the upper left in the figures). Thus, the properties (e.g. forward voltage) of this LED chip 2 can be measured by bringing probes into contact with the probe pads 151 and 152. Also, the probe pads 152 and 153 are electrically connected to each other via a single LED chip 2, so are the probe pads 153 and 154 and the probe pads 151 and 155. Thus, the properties of each LED chip 2 can be determined by bringing probes into contact with the relevant pair of probe pads.

Also, the properties of the electronic elements 6 can be determined by using paired probe pads 15. For example, the pair of probe pads 154 and 155 can be used to determine the properties of the electronic elements 6. The properties of other electronic elements 6 can also be determined by using an appropriate probe pad 15 and the relevant exposed portion of the wiring pattern 12 which surrounds a through-hole 111.

As shown in FIG. 12, in this embodiment, the (five) probe pads 15 are arranged in a region (first region R1) spaced apart from the center region of the substrate 1, at which the LED chips 2 are arranged, in the direction x perpendicular to the thickness direction of the substrate 1. The five probe pads 151-155 are aligned in the direction y perpendicular to both of the thickness direction of the substrate 1 and the direction x.

The LED lighting apparatus A2 of this embodiment has the same advantages as those described above with respect to the LED lighting apparatus A1.

Various design changes can be made to the specific configurations of the constituent parts of an LED lighting apparatus according to the present disclosure.

Variations of the foregoing embodiments are described below as clauses.

Clause 1.
An LED lighting apparatus comprising:
a plurality of LED chips; and
a substrate including a mount surface on which the LED chips are mounted,
wherein the LED chips are arranged at or near a center of the mount surface of the substrate,
the substrate includes a base and a wiring pattern formed on the base, the wiring pattern including a plurality of probe pads, and
the probe pads include a pair of probe pads that are electrically connected to each other via one of the LED chips.

Clause 2.
The LED lighting apparatus according to clause 1, further comprising an electronic element mounted on the substrate and including a circuit that causes the LED chips to emit light,
wherein the probe pads include a pair of probe pads that are electrically connected to each other via the electronic element.

Clause 3.
The LED lighting apparatus according to clause 1, wherein the probe pads include at least two probe pads arranged in a first region spaced apart in a first direction from a region where the LED chips are arranged, the first direction being perpendicular to a thickness direction of the substrate, and
the at least two probe pads are aligned in a second direction perpendicular to both of the thickness direction and the first direction.

Clause 4.
The LED lighting apparatus according to clause 1, wherein the probe pads include at least two probe pads arranged in each of a first region and a second region that are spaced apart from each other in a first direction across a region where the LED chips are arranged, the first direction being perpendicular to a thickness direction of the substrate, and
the at least two probe pads are aligned in each of the first region and the second region in a second direction perpendicular to both of the thickness direction and the first direction.

Clause 5.

The LED lighting apparatus according to clause 1, wherein the substrate includes an insulating layer formed on the base or the wiring pattern and formed with a plurality of openings, the probe pads comprise parts of the wiring pattern, respectively, and each of the parts of the wiring pattern is exposed through one of the openings of the insulating layer as viewed in a thickness direction of the substrate.

Clause 6.

The LED lighting apparatus according to clause 5, wherein one of the probe pads includes a metal plating layer covering one of the parts of the wiring pattern, and the metal plating layer is exposed through one of the openings of the insulating layer as viewed in the thickness direction of the substrate.

Clause 7.

The LED lighting apparatus according to clause 1, wherein a mounting density of the LED chips is in a range of 0.5 to 1.0 per 1 $mm^2$.

Clause 8.

The LED lighting apparatus according to clause 7, further comprising a wire bonded to one of the LED chips, wherein the wiring pattern includes a plurality of LED-mounting pads and a plurality of wire-bonding pads, one of the LED chips is mounted on one of the LED-mounting pads, and the wire is bonded to one of the wire-bonding pads.

Clause 9.

The LED lighting apparatus according to clause 8, wherein an area of each of the LED-mounting pads as viewed in the thickness direction of the substrate is at least twice an area of one of the LED chips as viewed in the thickness direction.

Clause 10.

The LED lighting apparatus according to clause 8, wherein the wire-bonding pads are farther away from a center of the substrate than the LED-mounting pads are, as viewed in the thickness direction of the substrate.

Clause 11.

The LED lighting apparatus according to clause 1, further comprising a frame formed on the substrate and surrounding the LED chips as viewed in the thickness direction of the substrate.

Clause 12.

The LED lighting apparatus according to clause 11, wherein the frame includes a reflective surface inclined with respect to the thickness direction of the substrate and surrounding the LED chips as viewed in the thickness direction of the substrate.

Clause 13.

The LED lighting apparatus according to clause 12, wherein the reflective surface is circular as viewed in the thickness direction of the substrate.

Clause 14.

The LED lighting apparatus according to clause 13, wherein the frame has a polygonal outer configuration as viewed in the thickness direction of the substrate.

Clause 15.

The LED lighting apparatus according to clause 11, wherein the frame is made of a white resin.

Clause 16.

The LED lighting apparatus according to clause 11, further comprising a sealing resin portion filling a region surrounded by the frame, wherein the sealing resin portion covers the LED chips and transmits light emitted from the LED chips.

Clause 17.

The LED lighting apparatus according to clause 16, wherein the sealing resin portion includes a first sealing resin part and a second sealing resin part, and each of the LED chips includes an obverse surface facing the same direction as the mount surface of the substrate, the first sealing resin part covers at least a part of each of the LED chips, and the part of each of the LED chips excludes the obverse surface of the each of the LED chips, and the second sealing resin part covers the first sealing resin part and transmits light.

Clause 18.

The LED lighting apparatus according to clause 17, wherein the first sealing resin part is made of a white resin.

Clause 19.

The LED lighting apparatus according to clause 1, further comprising a socket supporting the substrate.

Clause 20.

The LED lighting apparatus according to clause 19, wherein the socket includes a light-emitting cylindrical portion that houses the substrate and that is open in a direction in which the mount surface of the substrate faces.

Clause 21.

The LED lighting apparatus according to clause 20, wherein the socket includes a bottom plate portion closing the light-emitting cylindrical portion from a side opposite to the side to which the mount surface of the substrate faces.

Clause 22.

The LED lighting apparatus according to clause 21, further comprising a heat sink arranged between the bottom plate portion and the substrate.

Clause 23.

The LED lighting apparatus according to clause 22, wherein the heat sink is made of aluminum.

Clause 24.

The LED lighting apparatus according to clause 22, wherein the socket includes a fin projecting from the bottom plate portion away from the substrate.

Clause 25.

The LED lighting apparatus according to clause 24, wherein the socket includes a coupling-side cylindrical portion that houses at least a portion of the fin.

Clause 26.

The LED lighting apparatus according to clause 25, wherein the coupling-side cylindrical portion includes a stepped portion.

Clause 27.

The LED lighting apparatus according to clause 26, further comprising a packing fitted to the stepped portion of the coupling-side cylindrical portion.

Clause 28.

The LED lighting apparatus according to clause 1, wherein the LED chips include a plurality of first LED chips and a second LED chip, the plurality of first LED chips are connected in series to each other and arranged to form a circle as viewed in the thickness direction of the substrate, and the second LED chip is connected in parallel to the first LED chips and surrounded by the first LED chips as viewed in the thickness direction of the substrate.

The invention claimed is:

1. An LED lighting apparatus comprising:
   a plurality of LED chips;
   a substrate including a mount surface on which the LED chips are mounted; and
   an electronic element mounted on the substrate and including a circuit that causes the LED chips to emit light,
   wherein the LED chips are arranged at or near a center of the mount surface of the substrate,
   the substrate includes a base, a wiring pattern formed on the base, and an insulating layer formed on the base or the wiring pattern and formed with a plurality of openings,
   the wiring pattern includes a plurality of pad portions comprising parts of the wiring pattern, respectively,
   each of the parts of the wiring pattern is exposed through one of the openings of the insulating layer as viewed in a thickness direction of the substrate,
   each of the LED chips is mounted on one of the pad portions,
   the apparatus further comprises a socket supporting the substrate,
   the socket includes a light-emitting cylindrical portion that houses the substrate and that is open in a direction in which the mount surface of the substrate faces,
   the socket includes a bottom plate portion closing the light-emitting cylindrical portion from a side opposite to the side to which the mount surface of the substrate faces,
   the socket includes a fin projecting from the bottom plate portion away from the substrate,
   the socket includes a coupling-side cylindrical portion that houses at least a portion of the fin,
   the coupling-side cylindrical portion includes a stepped portion, and
   the LED lighting apparatus further comprises a packing fitted to the stepped portion of the coupling-side cylindrical portion.

2. The LED lighting apparatus according to claim 1, wherein one of the pad portions includes a metal plating layer covering one of the parts of the wiring pattern, and
   the metal plating layer is exposed through one of the openings of the insulating layer as viewed in the thickness direction of the substrate.

3. The LED lighting apparatus according to claim 1, further comprising a conductive paste layer positioned between one of the LED chips and one of the parts of the wiring pattern.

4. The LED lighting apparatus according to claim 3, wherein the opening of the insulating layer is circular as viewed in the thickness direction of the substrate.

5. The LED lighting apparatus according to claim 1, wherein a mounting density of the LED chips is in a range of 0.5 to 1.0 per 1 $mm^2$.

6. The LED lighting apparatus according to claim 5, further comprising a wire bonded to one of the LED chips,
   wherein the pad portions include a plurality of LED-mounting pads and a plurality of wire-bonding pads,
   one of the LED chips is mounted on one of the LED-mounting pads, and
   the wire is bonded to one of the wire-bonding pads.

7. The LED lighting apparatus according to claim 6, wherein an area of each of the LED-mounting pads as viewed in the thickness direction of the substrate is at least twice an area of one of the LED chips as viewed in the thickness direction.

8. The LED lighting apparatus according to claim 6, wherein the wire-bonding pads are farther away from a center of the substrate than the LED-mounting pads are, as viewed in the thickness direction of the substrate.

9. The LED lighting apparatus according to claim 1, further comprising a frame formed on the substrate and surrounding the LED chips as viewed in the thickness direction of the substrate.

10. The LED lighting apparatus according to claim 9, wherein the frame includes a reflective surface inclined with respect to the thickness direction of the substrate and surrounding the LED chips as viewed in the thickness direction of the substrate.

11. The LED lighting apparatus according to claim 10, wherein the reflective surface is circular as viewed in the thickness direction of the substrate.

12. The LED lighting apparatus according to claim 11, wherein the frame has a polygonal outer configuration as viewed in the thickness direction of the substrate.

13. The LED lighting apparatus according to claim 9, wherein the frame is made of a white resin.

14. The LED lighting apparatus according to claim 9, further comprising a sealing resin portion filling a region surrounded by the frame,
    wherein the sealing resin portion covers the LED chips and transmits light emitted from the LED chips.

15. The LED lighting apparatus according to claim 14, wherein the sealing resin portion includes a first sealing resin part and a second sealing resin part, and each of the LED chips includes an obverse surface facing the same direction as the mount surface of the substrate,
    the first sealing resin part covers at least a part of each of the LED chips, and the part of each of the LED chips excludes the obverse surface of the each of the LED chips, and
    the second sealing resin part covers the first sealing resin part and transmits light.

16. The LED lighting apparatus according to claim 15, wherein the first sealing resin part is made of a white resin.

17. The LED lighting apparatus according to claim 1, wherein the electronic element is mounted on the mount surface of the substrate.

18. The LED lighting apparatus according to claim 17, further comprising a heat sink arranged between the bottom plate portion and the substrate.

19. The LED lighting apparatus according to claim 18, wherein the heat sink is made of aluminum.

20. The LED lighting apparatus according to claim 1, wherein the LED chips include a plurality of first LED chips and a second LED chip,
    the plurality of first LED chips are connected in series to each other and arranged to form a circle as viewed in the thickness direction of the substrate, and
    the second LED chip is connected in parallel to the first LED chips and surrounded by the first LED chips as viewed in the thickness direction of the substrate.

21. An LED lighting apparatus comprising:
    a plurality of LED chips;
    a substrate including a mount surface on which the LED chips are mounted; and
    an electronic element mounted on the substrate and including a circuit that causes the LED chips to emit light,
    wherein the LED chips are arranged at or near a center of the mount surface of the substrate, the substrate includes a base, a wiring pattern formed on the base, and an insulating layer formed on the base or the wiring pattern and formed with a plurality of openings, the wiring pattern includes a plurality of pad portions comprising parts of the wiring pattern, respectively, each of the parts of the wiring pattern is exposed through one of the openings of the insulating layer as viewed in a thickness direction of the substrate, each of the LED chips is mounted on one of the pad portions, the apparatus further comprises a socket supporting the substrate, the socket includes a light-emitting cylindrical portion that houses the substrate and that is open in a direction in which the mount surface of the substrate faces, the socket includes a bottom plate portion that is formed integral with the light-emitting cylindrical portion and that supports the substrate, the bottom plate portion is formed with a first through-hole extending through the bottom plate portion, and the base is formed with a second through-hole extending through the base, and the second through-hole overlaps with the first through-hole as viewed in the thickness direction of the substrate.

22. The LED lighting apparatus according claim 21, further comprising a connection terminal that extends through the first through-hole and the second through-hole.

23. The LED lighting apparatus according claim 22, wherein the connection terminal has a first end and a second end that are spaced apart from each other, and the first end is electrically connected to the wiring pattern.

24. The LED lighting apparatus according claim 23, wherein the socket includes a coupling-side cylindrical portion opposite to the light-emitting cylindrical portion with respect to the bottom plate portion, the coupling-side cylindrical portion including a stepped portion, and the second end of the connection terminal is located farther from the base than is the stepped portion of the coupling-side cylindrical portion.

25. The LED lighting apparatus according claim 21, wherein the first through-hole is greater in diameter than the second through-hole.

26. The LED lighting apparatus according claim 25, wherein the first through-hole is greater in sectional area than the connection terminal as viewed in the thickness direction of the substrate.

* * * * *